(12) United States Patent
Morishita

(10) Patent No.: US 10,446,362 B2
(45) Date of Patent: Oct. 15, 2019

(54) DISTORTION CORRECTION METHOD AND ELECTRON MICROSCOPE

(71) Applicant: JEOL Ltd., Tokyo (JP)

(72) Inventor: Shigeyuki Morishita, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/012,057

(22) Filed: Jun. 19, 2018

(65) Prior Publication Data

US 2018/0366295 A1 Dec. 20, 2018

(30) Foreign Application Priority Data

Jun. 20, 2017 (JP) ................................. 2017-120642

(51) Int. Cl.

| | | |
|---|---|---|
| *H01J 37/153* | (2006.01) | |
| *H01J 37/22* | (2006.01) | |
| *H01J 37/14* | (2006.01) | |
| *H01J 37/28* | (2006.01) | |
| *H01J 37/302* | (2006.01) | |

(52) U.S. Cl.
CPC ............ *H01J 37/153* (2013.01); *H01J 37/14* (2013.01); *H01J 37/226* (2013.01); *H01J 37/28* (2013.01); *H01J 37/302* (2013.01); *H01J 2237/153* (2013.01); *H01J 2237/1534* (2013.01); *H01J 2237/24585* (2013.01); *H01J 2237/2802* (2013.01)

(58) Field of Classification Search
CPC ........ H01J 37/153; H01J 37/14; H01J 37/226; H01J 37/28; H01J 37/302; H01J 2237/153; H01J 2237/1534; H01J 2237/24585; H01J 2237/2802

USPC ............. 250/306, 307, 309, 310, 311, 492.1, 250/492.2, 492.21, 492.22, 492.23, 492.3
See application file for complete search history.

(56) References Cited

U.S. PATENT DOCUMENTS

| | | | | |
|---|---|---|---|---|
| 5,523,648 A | * | 6/1996 | Son ........................ | H01J 29/503 |
| | | | | 313/414 |
| 2002/0104970 A1 | * | 8/2002 | Winter ................... | B82Y 10/00 |
| | | | | 250/400 |

(Continued)

FOREIGN PATENT DOCUMENTS

| | | |
|---|---|---|
| JP | 2012109076 A | 6/2012 |
| JP | 201526431 A | 2/2015 |

OTHER PUBLICATIONS

Rose, Outline of a spherically corrected semiaplanatic medium-voltage transmission electron microscope, Institut für Angewandte Physik, Technische Hochschule Darmstadt, Mar. 22, 1990, pp. 19-24, vol. 85, No. 1, Hochschulstrasse 6 Darmstadt.

(Continued)

*Primary Examiner* — Nicole M Ippolito
(74) *Attorney, Agent, or Firm* — The Webb Law Firm

(57) ABSTRACT

There is provided a method which is for use in a charged particle beam system including an illumination system equipped with an aberration corrector having a plurality of stages of multipole elements and a transfer lens system disposed between the multipole elements, the method being capable of correcting distortion in a shadow of an aperture of the illumination system. The method involves varying excitations of the transfer lens system to correct distortion in the shadow of the aperture of the illumination system.

13 Claims, 15 Drawing Sheets

(56) References Cited

U.S. PATENT DOCUMENTS

| | | | |
|---|---|---|---|
| 2002/0185957 A1* | 12/2002 | Uchida | H01J 29/503 313/449 |
| 2003/0136905 A1* | 7/2003 | Franzen | H01J 49/062 250/292 |
| 2012/0119107 A1 | 5/2012 | Sawada et al. | |

OTHER PUBLICATIONS

Ellegaard et al., Electron Microscopy, Scientific Correspondence, Apr. 1998, pp. 768-769, vol. 392, Nature Macmillan Publishers Ltd.
Sawada et al., Correction of higher order geometrical aberration by triple 3-fold astigmatism field, Journal of Electron Microscopy, 2009, pp. 341-347, vol. 58, No. 6, Oxford University Press.
Sawada et al., Higher-order aberration corrector for an image-forming system in a transmission electron microscope, Ultramicroscopy, 2010, pp. 958-961, vol. 110, Elsevier.

* cited by examiner

DISTORTION CORRECTION METHOD AND ELECTRON MICROSCOPE

CROSS-REFERENCE TO RELATED APPLICATION

This application claims priority to Japanese Patent Application No. 2017-120642 filed Jun. 20, 2017, the disclosure of which is hereby incorporated in its entirety by reference.

BACKGROUND OF THE INVENTION

Field of the Invention

The present invention relates to a method of distortion correction and an electron microscope.

Description of Related Art

In charged particle beam systems such as transmission electron microscopes (TEMs) and scanning transmission electron microscopes (STEMs), aberration correction is an important technique in obtaining high-resolution images.

For example, H. Rose, *Optik*, Vol. 85 (1990), pp. 19-24 and H. Haider et al., *Nature*, Vol. 392 (1998), pp. 768-769 disclose two-stage, three-fold field type spherical aberration correctors in each of which two stages of hexapoles are arranged. In each of these known spherical aberration correctors, positive spherical aberration in an objective lens is canceled out by negative spherical aberration produced by a hexapole. Three-fold astigmatism produced by this hexapole can be corrected by hexapoles arranged in two stages. These known spherical aberration correctors can make corrections up to the fourth-order aberration by axial alignment and other techniques but cannot correct the fifth-order six-fold astigmatism, which in turn remains as a prevalent aberration.

In H. Sawada et al., *Journal of Electron Microscopy*, Vol. 58 (2009), pp. 341-347 and H. Sawada et al., *Ultramicroscopy* 110 (2010), pp. 958-961, there are disclosed three-stage, three-fold field type spherical aberration correctors in each of which three-fold fields are arranged in three stages. Although the above-described two-stage, three-fold field type spherical aberration correctors cannot correct six-fold astigmatism, the spherical aberration correctors of non-patent documents 3 and 4 correct six-fold astigmatism by having three-fold fields arranged in three stages.

Furthermore, JP-A-2012-109076 discloses a method of correcting five-fold astigmatism and three-lobe aberration in a three-stage, three-fold field type spherical aberration corrector.

In addition, JP-A-2015-26431 discloses a method of correcting distortion in the shadow of the condenser aperture of a multi-stage, three-fold field type spherical aberration corrector by superimposing an octopole field (four-fold field) on a multipole.

Where an aberration corrector is introduced into an illumination system, it is required to correct the aberrations. In addition, it is required that the shadow of the condenser aperture be a true circle, i.e., the angle of convergence of the electron beam be constant irrespective of direction. In the method disclosed in JP-A-2015-26431, two-fold symmetric distortion in the shadow of an aperture in the illumination system can be corrected by superimposing an octopole field (four-fold field) on the multipole. However, JP-A-2015-26431 does not disclose a method of correcting three-fold symmetric distortion in the shadow, for example, of an aperture in the illumination system.

In a scanning transmission electron microscope, the shape of the shadow of the illumination aperture (condenser aperture) assumes a cross-sectional shape of the electron probe. Where three-fold symmetric distortion remains in the shadow of the illumination aperture, the shape of the shadow of the aperture is not a circle but distorted into a triangular form. This presents the possibility that the resulting STEM image may be blurred three-fold symmetrically.

In recent years, the differential phase contrast (DPC) method has become known as a technique of visualizing the electromagnetic field within a sample by a scanning transmission electron microscope. In particular, the amount of deflection of an electron beam when passing through a sample and its direction are measured. The electromagnetic field in the sample which causes the deflection of the beam is computed. The amount of deflection and its direction when the electron beam is transmitted through the sample are obtained by analyzing the differences in the electron beam strength that are detected at various positions on a segmented detector.

When a measurement is made using the DPC method, the shadow of the illumination aperture (condenser aperture) is projected onto the segmented detector. Therefore, if three-fold symmetric distortion remains in the shadow of the illumination aperture, it is difficult to analyze the amount of deflection of the electron beam from the differences of electron beam strength detected at various positions on the segmented detector.

SUMMARY OF THE INVENTION

The present invention has been made in view of the foregoing problem. One object associated with some aspects of the present invention is to provide a method capable of correcting distortion in the shadow of an aperture of an illumination system. One object associated with some aspects of the present invention is to provide a charged particle beam system capable of correcting distortion in the shadow of the aperture of the illumination system.

A method of distortion correction associated with the present invention is for use in a charged particle beam system including an illumination system having a built-in aberration corrector to correct distortion in a shadow of an aperture of the illumination system. The aberration corrector contains plural stages of multipole elements and a transfer lens system disposed between the multipole elements. The method of distortion correction involves varying excitations of the transfer lens system, thus correcting the distortion in the shadow of the aperture.

This method of distortion correction is for use in the charged particle beam system equipped with the aberration corrector having the plural or multiple stages of multipole elements and can correct distortion in the shadow of the aperture of the illumination system. Furthermore, this method of aberration correction can correct three-fold symmetric distortion, for example, in the shadow of the aperture of the illumination system.

A charged particle beam system associated with the present invention includes: an illumination system including an aperture and an aberration corrector having plural stages of multipole elements and a transfer lens system disposed between the multipole elements; a distortion measuring section for measuring distortion in the shadow of the aperture; and a controller for controlling the aberration corrector. The controller provides control to vary excitations of the transfer lens system on the basis of the results of measurements of distortion in the shadow of the aperture.

In this charged particle beam system equipped with the aberration corrector having the plural or multiple stages of multipole elements, distortion in the shadow of the aperture in the illumination system can be corrected. Furthermore, in this charged particle beam system, three-fold symmetric distortion, for example, in the shadow of the aperture of the illumination system can be corrected.

DESCRIPTION OF THE INVENTION

Embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

In the following description, a scanning transmission electron microscope having an illumination system in which an aberration corrector is incorporated is taken as one example of the charged particle beam system associated with the present invention. There are no restrictions on the charged particle beam system associated with the present invention as long as an aberration corrector is incorporated in its illumination system. For example, the charged particle beam system associated with the present invention may be an instrument in which observation, analysis, and other operations are performed on a sample by illuminating it with a charged particle beam (such as an ion beam) other than an electron beam.

1. First Embodiment 1.1. Electron Microscope

Figure 1:
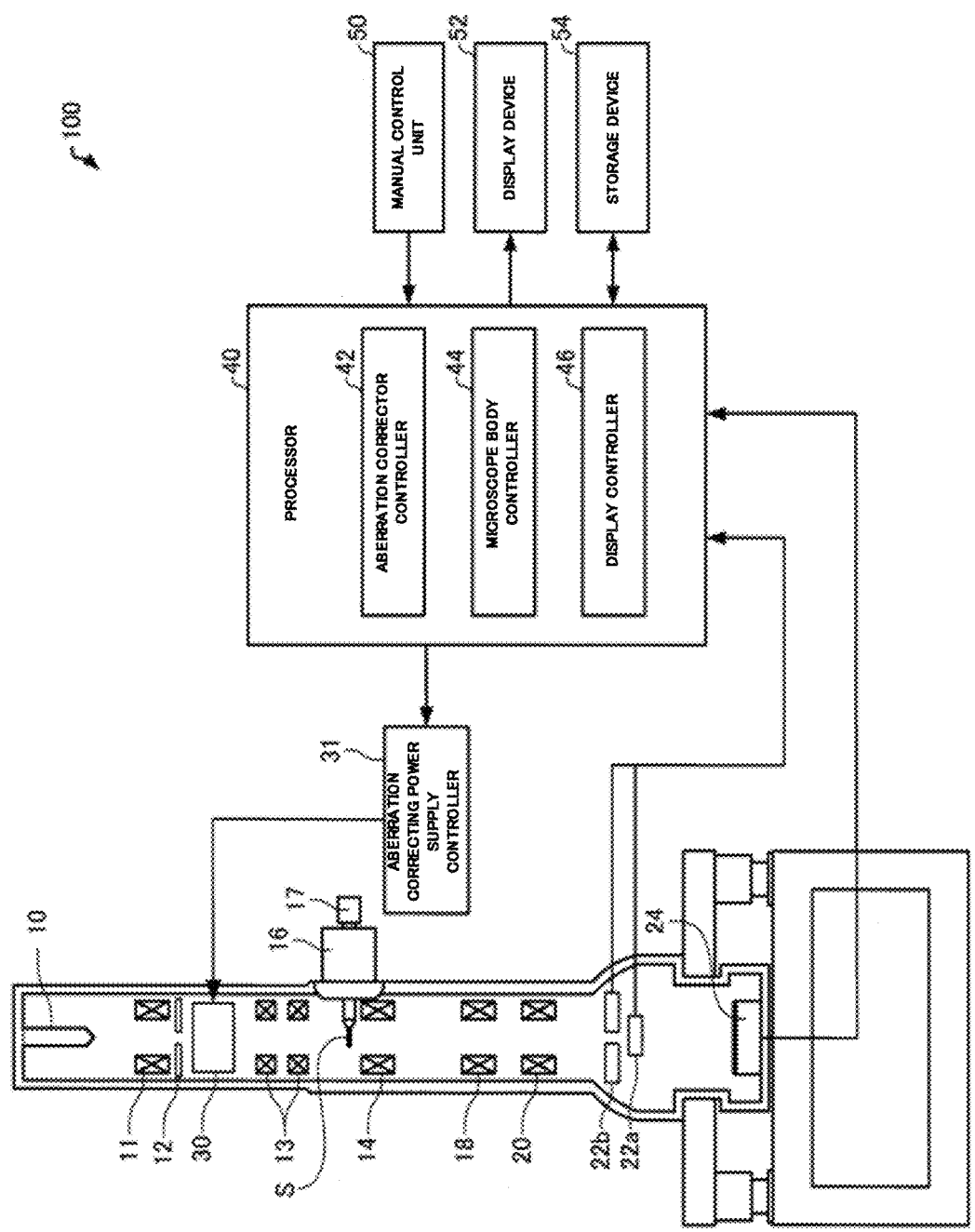
FIG. 1 is a vertical cross section, partly in block form, of an electron microscope associated with a first embodiment of the present invention.

An electron microscope associated with a first embodiment of the present invention is first described by referring to FIG. 1, which shows the configuration of the electron microscope associated with the first embodiment.

The electron microscope, 100, is a scanning transmission electron microscope (STEM) equipped with an aberration corrector 30. The scanning transmission electron microscope is an instrument for obtaining a scanning transmission electron microscope (STEM) image by scanning an electron probe (focused electron beam) over a sample S and detecting electrons transmitted through the sample S.

As shown in FIG. 1, the electron microscope 100 includes an electron source 10, a condenser lens system 11, a condenser aperture 12, scan coils 13, an objective lens 14, a sample stage 16, a sample holder 17, an intermediate lens 18, a projector lens 20, STEM detectors 22a, 22b, an imager 24, a processor 40, a manual control unit 50, a display device 52, and a storage device 54, as well as the aberration corrector 30.

The electron source 10 produces electrons. For example, the electron source 10 is an electron gun that emits an electron beam by accelerating electrons, released from a cathode, by means of an anode.

The condenser lens system 11 focuses the electron beam released from the electron source 10. The condenser lens system 11 may be made up of a plurality of electron lenses (not shown). The condenser lens system 11 and the objective lens 14 together constitute an illumination system for focusing the electron beam onto the sample S.

The condenser aperture 12 is incorporated in the illumination system of the electron microscope 100. The illumination system is an electron optical system for illuminating the sample S with the electron beam (electron probe). There is no restriction on the position of the condenser aperture 12 as long as it is located ahead of the sample S (i.e., on a side of the electron source 10). The condenser aperture 12 cuts out unwanted portions of the electron beam.

The scan coils 13 operate such that the electron beam (electron probe) focused by the condenser lens system 11 and objective lens 14 is scanned over the sample S by deflecting the electron beam. The scan coils 13 deflect the electron probe on the basis of a scan signal generated by a control unit (not shown) of the electron microscope 100. As a result, the electron probe can be scanned over the sample S.

The objective lens 14 is used to form the electron probe by focusing the electron beam onto the sample S. The objective lens 14 images the electrons transmitted through the sample S.

The sample stage 16 holds the sample S. In the illustrated example, the sample stage 16 holds the sample S via the sample holder 17. The sample stage 16 can move the sample S horizontally or vertically or tilt the sample S.

The intermediate lens 18 and projector lens 20 cooperate to guide the electrons transmitted through the sample S to the STEM detectors 22a and 22b. Furthermore, the intermediate lens 18 and projector lens 20 together operate to further magnify the image focused by the objective lens 14 and to bring the image into focus on the imager 24. The objective lens 14, intermediate lens 18, and projector lens 20 together constitute the imaging system of the electron microscope 100.

The STEM detector 22a that is a bright field STEM detector detects those electrons which are transmitted through the sample S without being scattered by the sample S and electrons scattered by the sample S at angles less than a given angle. Although the bright field STEM detector 22a is located on the optical axis, if the imager 24 is used, the detector 22a can be removed from the optical axis.

The STEM detector 22b which is a dark field STEM detector detects electrons which are scattered from the sample S at the certain angle. The dark field STEM detector 22b is an annular detector.

The imager 24 captures the image focused by the imaging system. For example, the imager 24 is a digital camera such as a CCD camera.

The aberration corrector 30 is incorporated in the illumination system of the electron microscope 100. In the illustrated example, the aberration corrector 30 is located behind the condenser lens system 11. The aberration corrector 30 is an instrument for correcting aberrations in the illumination system of the electron microscope 100. In particular, the aberration corrector 30 is a spherical aberration corrector for correcting the spherical aberration in the illumination system by creating a negative spherical aberration and canceling out the positive spherical aberration in the illumination system.

In the electron microscope 100, the electron beam emitted from the electron source 10 is focused into an electron probe by the condenser lens system 11 and objective lens 14 and made to impinge on the sample S. At this time, the spherical aberration in the illumination system is corrected by the aberration corrector 30. The electron beam impinging on the sample S is scanned over the sample S by the scan coils 13. The electron beam transmitted through the sample S is guided to the STEM detectors 22a and 22b by the objective lens 14, intermediate lens 18, and projector lens 20 and detected by these detectors 22a, 22b. The output signals from the STEM detectors 22a and 22b which represent intensity information about electrons are sent to a frame memory (not shown). The frame memory stores the output signals of the STEM detectors 22a and 22b at specified storage addresses based on the scan signals. Consequently, a bright-field STEM image and a dark-field STEM image can be obtained.

Furthermore, in the electron microscope 100, the electron beam is constricted on the sample surface by the condenser lens system 11 and objective lens 14 and forms an electron probe. An image (real space image) of the electron probe itself can be captured by the imager 24 or an image (reciprocal space image) of the shadow of the condenser aperture 12 can be captured by adjusting the lenses of the imaging system while halting the electron probe at one point (i.e., the scanning is halted).

In addition, in the electron microscope 100, the amount of deflection of the electron beam and its direction when the beam passes through the sample S can be measured by directing the electron probe at the sample S and detecting the electron beam transmitted through the sample S by the segmented detector in a manner not illustrated. This method is referred to as the differential phase contrast (DPC). When a measurement is made by a DPC method, a shadow of the condenser aperture 12 is projected onto the segmented detector by the imaging system of the electron microscope 100.

Figure 2:
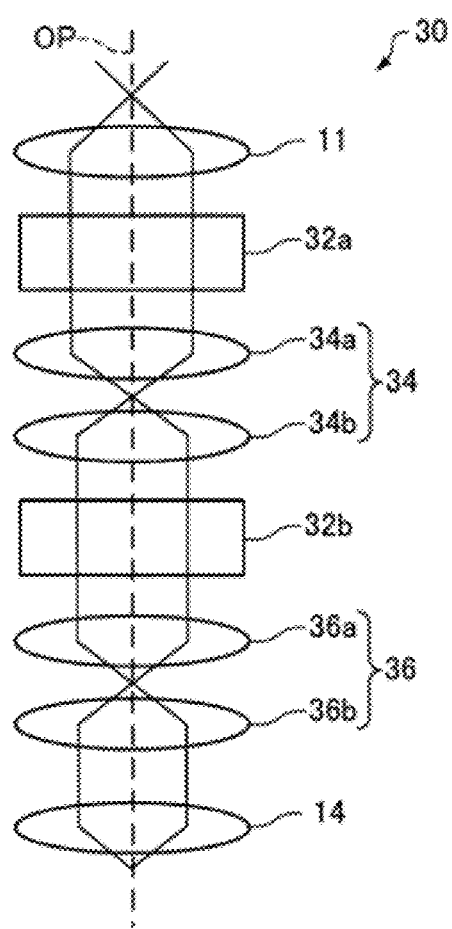
FIG. 2 is a schematic electron ray diagram for an aberration corrector included in the electron microscope shown in FIG. 1.

FIG. 2 schematically shows the aberration corrector 30. As shown in FIG. 2, the aberration corrector 30 is configured including two stages of multipole elements (first multipole element 32a and second multipole element 32b) and a transfer lens system 34. That is, the aberration corrector 30 is a two-stage, three-fold field type spherical aberration corrector.

In the aberration corrector 30, the first multipole element 32a and second multipole element 32b are arranged in a line along the optical axis OP. The first multipole element 32a produces a three-fold field (three-fold symmetric field). Similarly, the second multipole element 32b produces a three-fold field. A three-fold field referred to herein is a field whose strength has three-fold symmetry.

The first multipole element 32a is made of a hexapole element, for example. No restrictions are imposed on the numbers of poles of the first and second multipole elements 32a, 32b. A three-fold field generated by the first multipole element 32a is an electrostatic field, a static magnetic field, or a superimposition thereof.

The second multipole element 32b is similar to the above-described first multipole element 32a. That is, the second multipole element 32b is made of a hexapole element, for example. A three-fold field generated by the second multipole element 32b is an electrostatic field, a static magnetic field, or a superimposition thereof.

Each of the first multipole element 32a and second multipole element 32b has a thickness of t along the optical axis OP. In a multipole element having a thickness, aberrations different from aberrations produced in a thin multipole element appear as combination aberrations. Where a three-fold field is produced in a multipole element, a negative spherical aberration appears as a combination aberration. Utilizing this, positive spherical aberration in an optical system can be corrected.

The transfer lens system 34 is disposed between the first multipole element 32a and the second multipole element 32b. The transfer lens system 34 is made of a pair of transfer lenses (first transfer lens 34a and second transfer lens 34b). The first transfer lens 34a and second transfer lens 34b are arranged along the optical axis OP. An image conjugate to the image formed by the first multipole element 32a is formed in the second multipole element 32b by the transfer lens system 34.

Another transfer lens system 36 may be disposed between the second multipole element 32b and the objective lens 14. The transfer lens system 36 is made of a pair of transfer lenses (first transfer lens 36a and second transfer lens 36b).

The manual control unit 50 obtains a control signal responsive to a user's manipulation and sends the signal to the processor 40. The function of the manual control unit 50 can be implemented, for example, by buttons, keys, a touch panel display, a microphone, or the like.

The display device 52 displays images generated by the processor 40. The function of the display device 52 can be realized by an LCD, a CRT, or the like. A captured STEM image or other image is displayed on the display device 52.

Programs, data, and related information permitting the processor 40 to perform various calculational operations and control operations are stored in the storage device 54. The storage device 54 is used as a working area for the processor 40, and used to temporarily store the results of calculations and other processing performed by the processor 40 in accordance with various programs. The function of the storage device 54 can be realized by a hard disk, a RAM, or the like.

The processor 40 performs processing including a processing operation for controlling the aberration corrector 30, processing operations for controlling the body of the electron microscope including the optical system and sample stage 16 but excluding the aberration corrector 30, a processing operation for displaying an image captured by the imager 24 on the display device 52, and a processing operation for displaying an STEM image on the display device 52. The functions of the processor 40 can be implemented by hardware (such as various processors, e.g., a CPU, a DSP, or the like) or software. The processor 40 includes an aberration corrector controller 42, a microscope body controller 44, and a display controller 46.

The aberration corrector controller 42 controls an aberration correcting power supply controller 31 to control a current or voltage supplied to the aberration corrector 30. For example, the aberration corrector controller 42 controls the exciting currents supplied to the first transfer lens 34a and second transfer lens 34b by controlling the aberration correcting power supply controller 31 on the basis of the control signal from the manual control unit 50.

The microscope body controller 44 controls the body of the electron microscope. The body controller 44 controls power supplied to the body of the electron microscope by controlling a microscope body power supply controller (not shown).

The display controller 46 provides control such that image data is read from the frame memory and that an STEM image is displayed on the display device 52. Furthermore, the display controller 46 provides control such that image data about an image captured by the imager 24 is obtained and displayed on the display device 52.

1.2. Method of Distortion Correction

Figure 3:
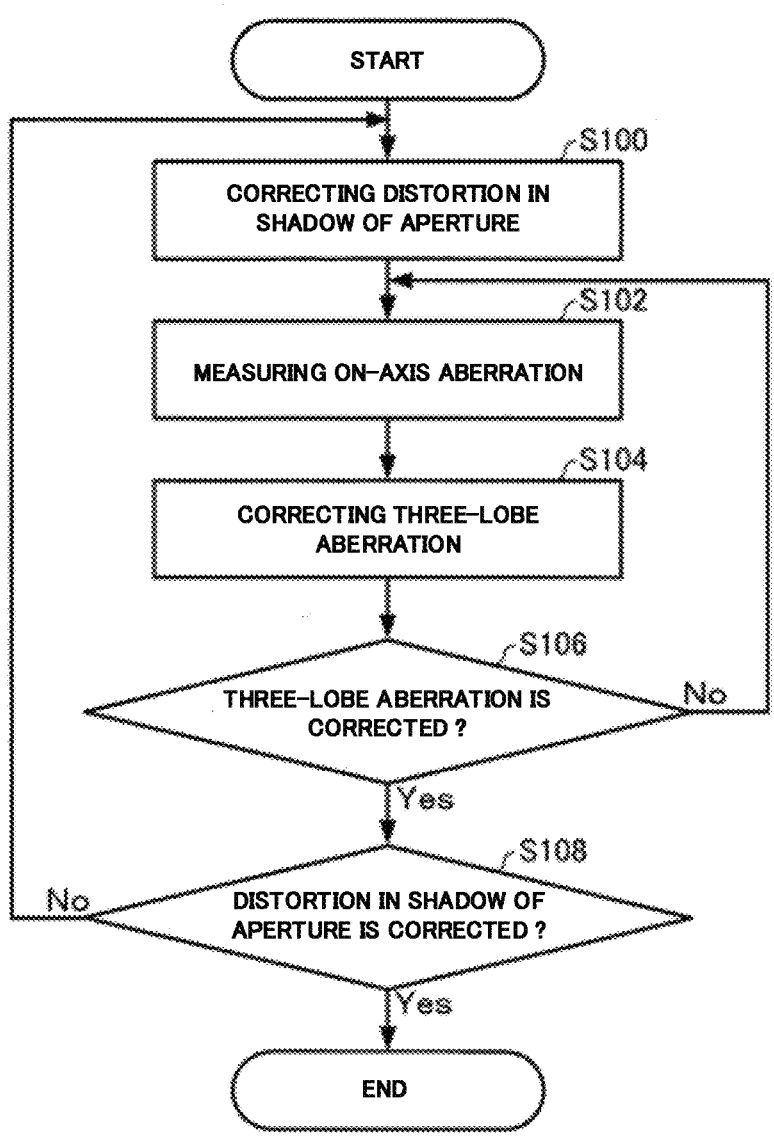
FIG. 3 is a flowchart illustrating one example of the method of distortion correction associated with the first embodiment.

A method of distortion correction associated with the first embodiment is next described. In the electron microscope 100, three-fold symmetric distortion is produced in the shadow of the condenser aperture 12 by producing three-fold fields from the first multipole element 32a and second multipole element 32b of the aberration corrector 30. In the present embodiment, the three-fold symmetric distortion in the shadow of the condenser aperture 12 is corrected. FIG. 3 is a flowchart illustrating one example of the method of distortion correction associated with the first embodiment.

(1) Correction of Three-Fold Symmetric Distortion in Shadow of Condenser Aperture (S100)

First, the excitation of the transfer lens system 34 is varied to correct the three-fold symmetric distortion in the shadow of the condenser aperture 12.

Figure 4:
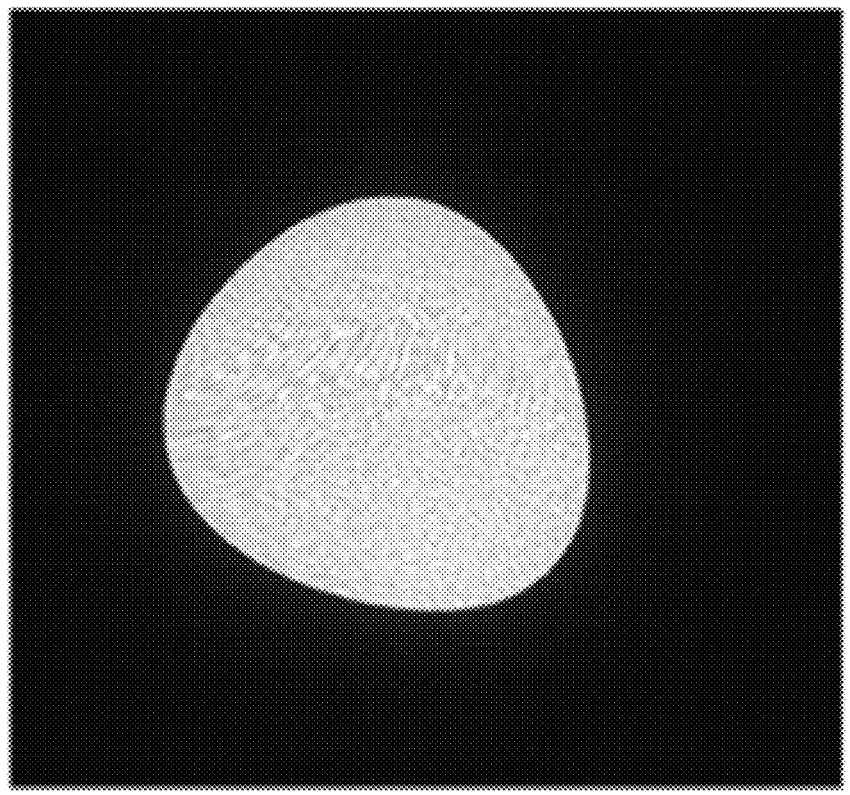
FIG. 4 is an image of the shadow of a condenser aperture of the electron microscope of FIG. 1.

FIG. 4 is an image of the shadow of the condenser aperture 12. In the image of FIG. 4, the shadow of the condenser aperture 12 is distorted three-fold symmetrically.

The shadow of the condenser aperture 12 can be checked either with the image displayed on a fluorescent screen or with the image which is displayed on the display device 52 after being captured by the imager 24.

Figure 5:
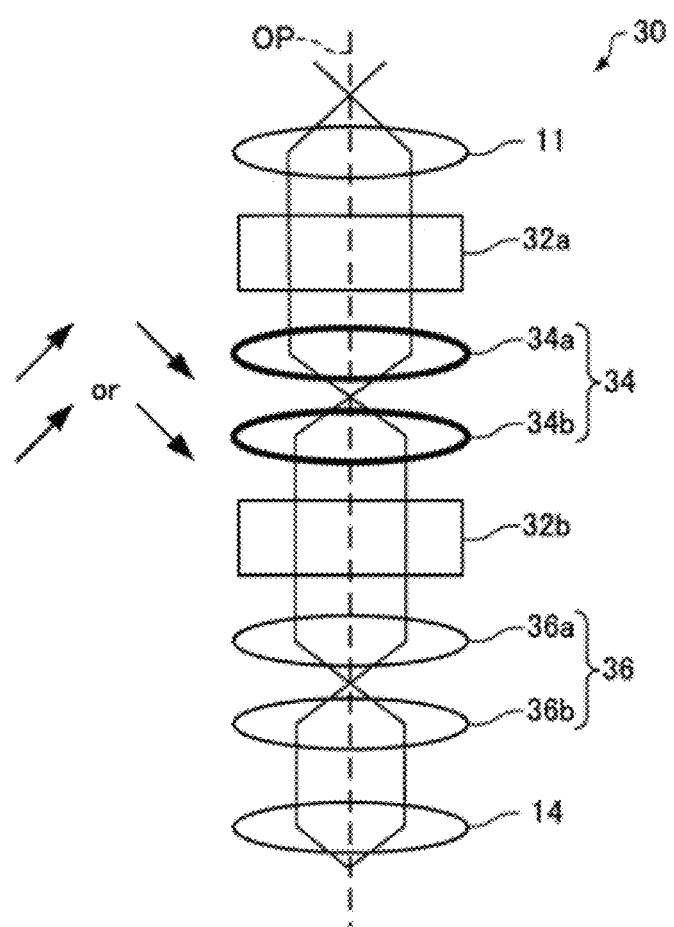
FIG. 5 is an electron ray diagram illustrating the manner in which three-fold symmetric distortion in the shadow of the condenser aperture is corrected by varying excitations of a transfer lens system.

FIG. 5 is an electron ray diagram illustrating the manner in which three-fold symmetric distortion in the shadow of the condenser aperture 12 is corrected by varying excitations of the transfer lens system 34.

The correction of the three-fold symmetric distortion in the shadow of the condenser aperture 12 is carried out by varying the excitations of both first transfer lens 34a and second transfer lens 34b such that the excitations are both increased as indicated by the upward arrows in FIG. 5 or that the excitations are both decreased as indicated by the downward arrows.

The transfer distance can be varied by varying the excitations of the first transfer lens 34a and second transfer lens 34b as shown in FIG. 5. As a result, the three-fold symmetric distortion in the shadow of the condenser aperture 12 varies. The excitation of the first transfer lens 34a can be varied by controlling the exciting current through a coil constituting the first transfer lens 34a. The same principle applies to the second transfer lens 34b.

If the excitations of the first transfer lens 34a and second transfer lens 34b are varied, on-axis aberration (more specifically, three-lobe aberration) varies together with the three-fold symmetric distortion in the shadow of the condenser aperture 12. When either stronger excitations or weaker excitations of both first transfer lens 34a and second transfer lens 34b are caused as noted above, the amount of variation of the three-fold symmetric distortion in the shadow of the condenser aperture 12 can be made larger than the amount of variation of the three-lobe aberration.

An on-axis aberration referred to herein is one of geometric aberrations and has only one parameter that is the angle α relative to the optical axis. A three-lobe aberration is one of fourth-order, on-axis geometric aberrations and is a parasitic aberration of three-fold symmetry.

In geometric optics where the orbit of electrons are described as motion of charged particles within an electromagnetic field, the deviation of an image focal point from an ideal image focal point (Gaussian image point) is referred to as a geometric aberration. Optical characteristics are generally expressed by a power-series polynomial which performs a mapping from one point on an object plane to one point on an image plane. This polynomial is power series expanded while taking the distance r of the electron orbit on the object plane from the optical axis and the angle α relative to the optical axis as parameters. With respect to the parameters r and α, if only their first-order terms are taken into account, an ideal image focal point free of aberrations (Gaussian image point) is represented. If second or higher orders are taken into consideration, the image focal point deviates from its ideal image focal point. The sum of the orders of the angle α relative to the optical axis and the distance r from the optical axis is the order of geometric aberration.

The excitations of the first transfer lens 34a and second transfer lens 34b are varied by the user, for example, by manipulating the manual control unit 50 while watching the shadow of the condenser aperture 12 displayed on a fluorescent screen or on the display device 52 and checking the degree of distortion and entering those amounts of excitations of the first transfer lens 34a and second transfer lens 34b which reduce the distortion. Consequently, the three-fold symmetric distortion in the shadow of the condenser aperture 12 can be corrected. Alternatively, a true circle may be drawn, for example, on the fluorescent screen or display screen of the display device 52. The excitations of the first transfer lens 34a and second transfer lens 34b may be varied so as to bring the shadow of the condenser aperture 12 into coincidence with the true circle.

(2) Measurement of On-Axis Aberration (S102)

Then, on-axis aberration is measured. If the excitations of the first transfer lens 34a and second transfer lens 34b are varied to correct the three-fold symmetric distortion in the shadow of the condenser aperture 12, the three-lobe aberration being one of on-axis aberrations also varies as described previously. Therefore, it is necessary to correct the three-lobe aberration.

An on-axis aberration that is a three-lobe aberration can be measured, for example, by an SRAM (segmental Ronchigram Autocorrelation function Matrix) method or a probe tableau method.

An SRAM method is a technique consisting of obtaining a Ronchigram, dividing it into segments, deriving an autocorrelation function of each segment, and computing aberrations from the shapes of the autocorrelation functions. A Ronchigram is a projected image or pattern of a sample formed on a diffraction plane after focusing an electron beam to the vicinity of the sample S by the illumination system.

A probe tableau method is a technique consisting of capturing a plurality of STEM images while varying the angle of impingement of an electron beam on a sample surface, deconvoluting the STEM images to produce probe images, and measuring aberrations based on the probe images.

(3) Correction of Three-Lobe Aberration (S104)

Then, the three-lobe aberration is corrected based on the results of measurements of the on-axis aberration. This correction is carried out by varying the excitations of the transfer lens system 34.

Figure 6:
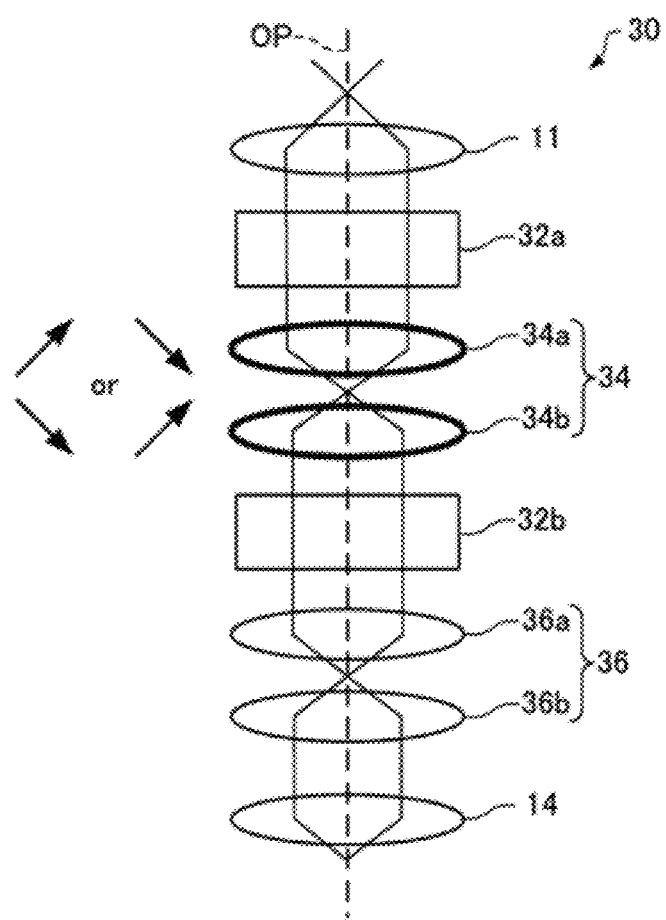
FIG. 6 is a schematic electron ray diagram illustrating the manner in which three-lobe aberration is corrected by varying excitations of the transfer lens system.

FIG. 6 schematically illustrates the manner in which three-lobe aberration is corrected by varying excitations of the transfer lens system 34.

The correction of the three-lobe aberration is carried out by varying the excitations of the first transfer lens 34a and second transfer lens 34b such that the excitation of one of the transfer lenses 34a, 34b is increased while the excitation of the other is decreased as shown in FIG. 6. This can correct three-lobe aberration. Furthermore, by varying the excitations of the transfer lenses 34a and 34b in this way, the amount of variation of the three-lobe aberration can be made larger than that of the three-fold symmetric distortion in the shadow of the condenser aperture 12.

(4) Decision as to Whether Three-Lobe Aberration Has Been Corrected (S106)

Then, a decision is made as to whether the three-lobe aberration has been corrected. This decision is carried out by measuring the on-axis aberration (three-lobe aberration) by an SRAM method or a probe tableau method in the same way as for the step (S102) of measuring the on-axis aberration.

If the decision at step S106 is negative (No), indicating that the user has determined that the three-lobe aberration is uncorrected from the result of the measurement of the on-axis aberration, the measurement of the on-axis aberration (S102) and the correction of the three-lobe aberration (S104) are made again.

(5) Decision as to Whether Three-Fold Symmetric Distortion in Shadow of Condenser Aperture Has Been Corrected (S108)

If the decision at step S106 is affirmative (Yes), indicating that the user has determined that the three-lobe aberration has been corrected, then a decision is made as to whether the three-fold symmetric distortion in the shadow of the condenser aperture 12 has been corrected. For example, the user makes a decision as to whether the three-fold symmetric distortion has been corrected by watching the shadow of the condenser aperture 12 displayed on the fluorescent screen or on the display device 52.

If the decision at step S108 is No, indicating that the user has determined that the three-fold symmetric distortion in the shadow of the condenser aperture 12 is uncorrected, control returns to step S100, and then steps S100-S106 are performed. On the other hand, if the decision at step S108 is Yes, indicating that the user has determined that the three-fold symmetric distortion in the shadow of the condenser aperture 12 has been corrected, the correction of the three-fold symmetric distortion in the shadow of the condenser aperture 12 is ended. Optimum conditions for the transfer lens system 34 can be accomplished by making the correction of the three-fold symmetric distortion in the shadow of the condenser aperture 12 and the correction of the three-lobe aberration repeatedly in this way. Both the three-fold symmetric distortion in the shadow of the condenser aperture 12 and the three-lobe aberration can be minimized.

Figure 7:
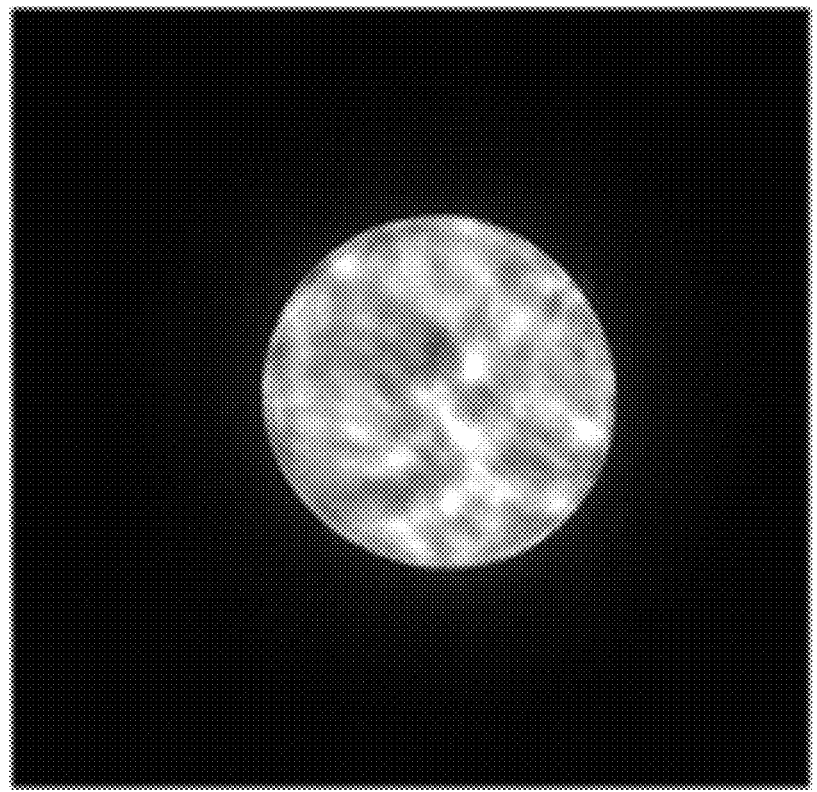
FIG. 7 is another image of the shadow of the condenser aperture.

FIG. 7 is an image of the shadow of the condenser aperture 12. It can be seen from FIG. 7 that the shadow of the condenser aperture 12 is circular in shape, indicating that the three-fold symmetric distortion has been corrected.

The method of distortion correction associated with the present embodiment has the following features. This method of distortion correction involves the step of correcting three-fold symmetric distortion in the shadow of the condenser aperture 12 by varying the excitations of the transfer lens system 34 that is disposed between the first multipole element 32a and the second multipole element 32b. Therefore, the method of distortion correction associated with the present embodiment is for use in the electron microscope 100 equipped with the aberration corrector 30 having the two stages of multipole elements 32a and 32b and can correct the three-fold symmetric distortion in the shadow of the condenser aperture 12. Consequently, the angle of convergence of the electron beam (electron probe) impinging on the sample S can be made constant irrespective of direction. Hence, it is possible to prevent an STEM image from becoming blurred three-fold symmetrically. Furthermore, since the three-fold symmetric distortion in the shadow of the condenser aperture 12 is corrected and the shadow of the condenser aperture 12 can be made a true circle, when a measurement is made by a DPC method, the amount of deflection of the electron beam can be analyzed from the differences in electron beam intensity detected at various positions on the segmented detector.

In the method of aberration correction associated with the present embodiment, during the step of correcting three-fold symmetric distortion in the shadow of the condenser aperture 12, the excitations of the first transfer lens 34a and second transfer lens 34b are varied in such a way that the excitations are both increased or both decreased. Consequently, the amount of variation of the three-fold symmetric distortion in the shadow of the condenser aperture 12 can be made larger than the amount of variation of the three-lobe aberration. Accordingly, during the step of correcting the three-fold symmetric distortion in the shadow of the condenser aperture 12, the amount of variation of the three-lobe aberration can be reduced.

The method of aberration correction associated with the present embodiment involves the step of correcting the three-lobe aberration by varying excitations of the transfer lens system 34. Therefore, the three-lobe aberration induced by correcting the three-fold symmetric distortion in the shadow of the condenser aperture 12 can be corrected. As a result, a better high-resolution image can be obtained.

In the method of distortion correction associated with the present embodiment, during the step of correcting three-lobe aberration, the excitations of the first transfer lens 34a and the second transfer lens 34b are varied such that the excitation of one of the lenses 34a, 34b is increased while the excitation of the other is reduced. In consequence, the amount of variation of the three-lobe aberration can be made larger than the amount of variation of the three-lobe symmetric distortion in the shadow of the condenser aperture 12. Thus, during the step of correcting the three-lobe aberration, the amount of variation of the three-lobe symmetric distortion in the shadow of the condenser aperture 12 can be reduced.

2. Second Embodiment 2.1. Electron Microscope

Figure 8:
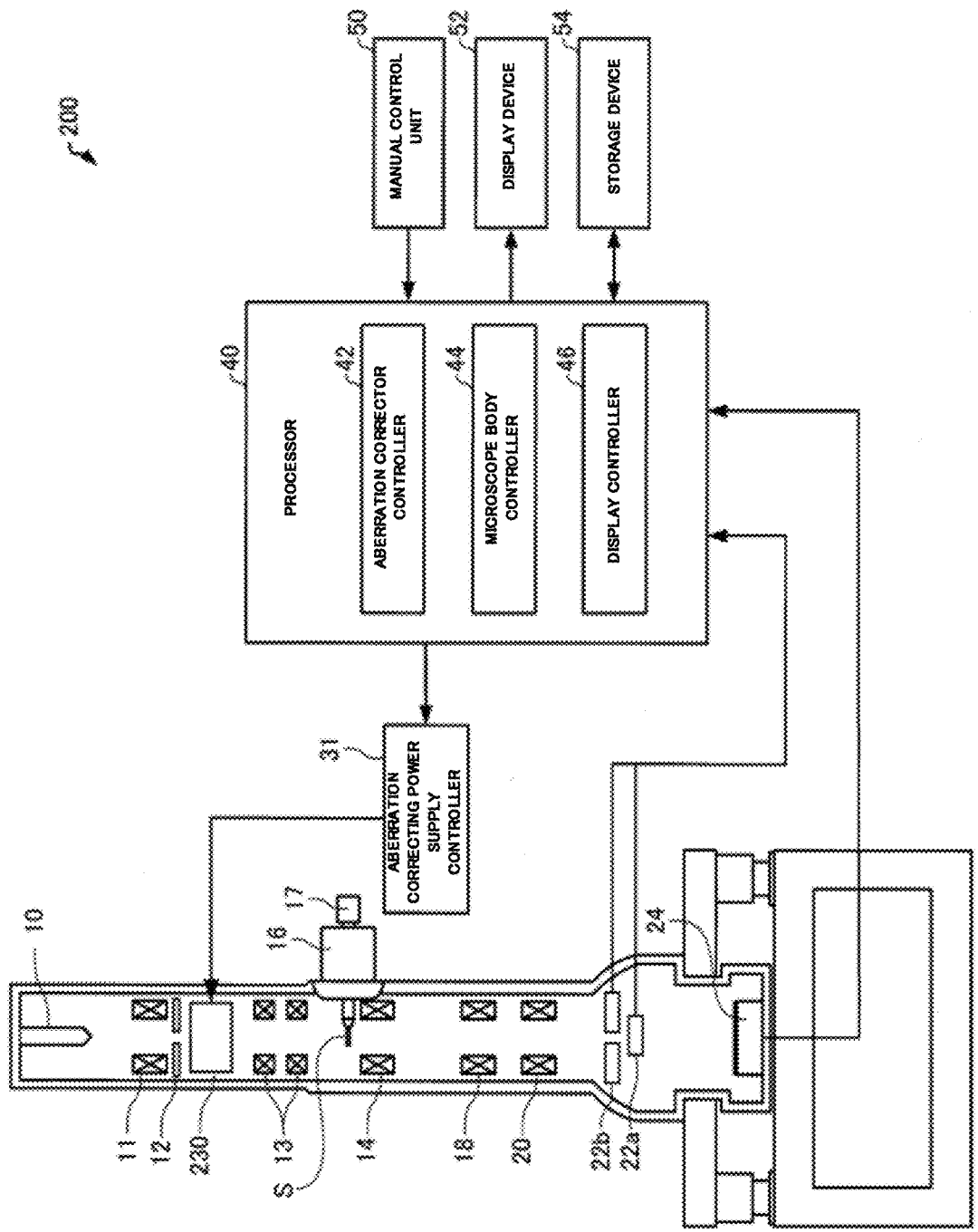
FIG. 8 is a vertical cross section, partly in block form, of an electron microscope associated with a second embodiment.
Figure 9:
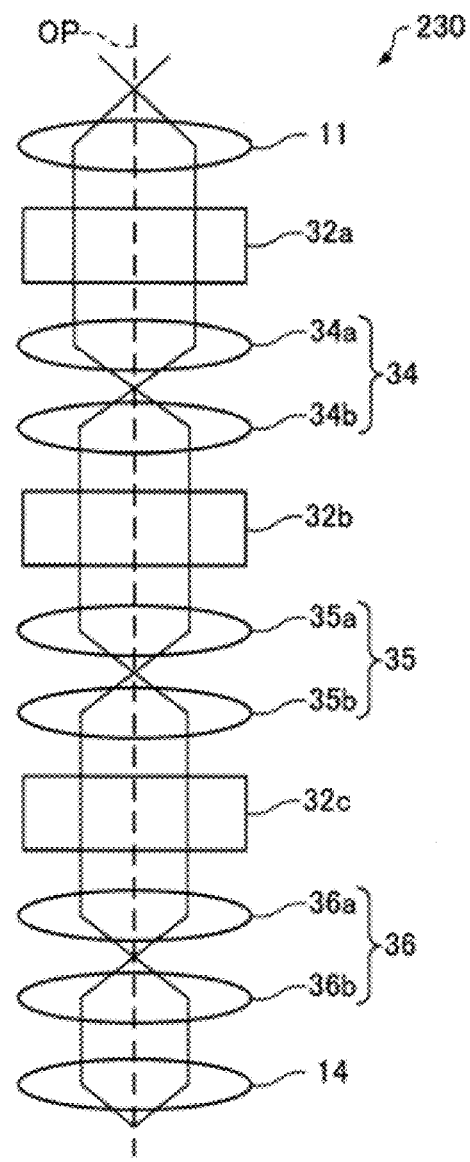
FIG. 9 is a schematic electron ray diagram for an aberration corrector included in the electron microscope shown in FIG. 8.

An electron microscope associated with a second embodiment is next described by referring to FIGS. 8 and 9. FIG. 8 schematically shows the electron microscope, 200, associated with the second embodiment. FIG. 9 schematically shows an aberration corrector 230 of the electron microscope 200.

In the electron microscope 200 associated with the second embodiment, those members which are similar in function to their respective counterparts of the electron microscope 100 associated with the first embodiment are indicated by the same reference numerals as in the above cited figures and a detailed description thereof is omitted.

In the above-described electron microscope 100, as shown in FIG. 2, the aberration corrector 30 has two stages of multipole elements 32a and 32b. That is, the aberration corrector 30 is a two-stage, three-fold field type spherical aberration corrector.

On the other hand, in the electron microscope 200, the aberration corrector 230 has three stages of multipole elements 32a, 32b, and 32c as shown in FIGS. 8 and 9. That is, the aberration corrector 230 is a three-stage, three-fold field type spherical aberration corrector.

The aberration corrector 230 is configured including the three stages of multipole elements (first multipole element 32a, second multipole element 32b, and third multipole element 32c), a first transfer lens system 34, and a second transfer lens system 35.

In the aberration corrector 230, the first multipole element 32a, second multipole element 32b, and third multipole element 32c are arranged in a line along the optical axis OP.

The first multipole element 32a, second multipole element 32b, and third multipole element 32c are similar in configuration to the above-described first multipole elements 32a and second multipole element 32b shown in FIG. 2 and thus a description of the three multipole elements 32a-32c is omitted.

The first transfer lens system 34 is located between the first multipole element 32a and second multipole element 32b. The second transfer lens system 35 is positioned between the second multipole element 32b and third multipole element 32c. The second transfer lens system 35 has a first transfer lens 35a and a second transfer lens 35b.

The first transfer lens system 34 and the second transfer lens system 35 are similar in configuration to the transfer lens system 34 of the above-described first embodiment and a description thereof is omitted. A further transfer lens system 36 may be disposed between the third multipole element 32c and the objective lens 14.

In the two-stage, three-fold field type aberration corrector shown in FIG. 2, the three-fold astigmatism produced by the first multipole element 32a is canceled out by the three-fold astigmatism generated by the second multipole element 32b as described previously. However, cancellation of the three-fold astigmatism by a pair of three-fold fields generated by the first multipole element 32a and second multipole element 32b results in a new six-fold astigmatism that is a fifth-order aberration.

On the other hand, in the three-stage, three-fold field type aberration corrector shown in FIG. 9, the six-fold astigmatism produced by the combination of aberrations generated by the three-fold fields respectively set up by the three stages of multipole elements 32a, 32b, and 32c can be canceled out by establishing a given angular relationship among the three three-fold fields.

2.2. Method of Distortion Correction

A method of distortion correction associated with the second embodiment is next described. The method of distortion correction associated with the second embodiment is similar to the method of distortion correction associated with the first embodiment except for the step S100 of correcting the three-fold symmetric distortion in the shadow of the condenser aperture 12 and for the step S104 of correcting the three-lobe aberration as illustrated in FIG. 3.

The differences of the method of distortion correction associated with the second embodiment from the method of distortion correction associated with the first embodiment are described below; a description of similarities is omitted.

First, step S100 of correcting the three-fold symmetric distortion in the shadow of the condenser aperture 12 is described. In the present embodiment, correction of the three-fold symmetric distortion in the shadow of the condenser aperture 12 is carried out by varying excitations of the first transfer lens system 34 disposed between the first multipole element 32a and the second multipole element 32b and varying excitations of the second transfer lens system 35 disposed between the second multipole element 32b and the third multipole element 32c.

Figure 10:
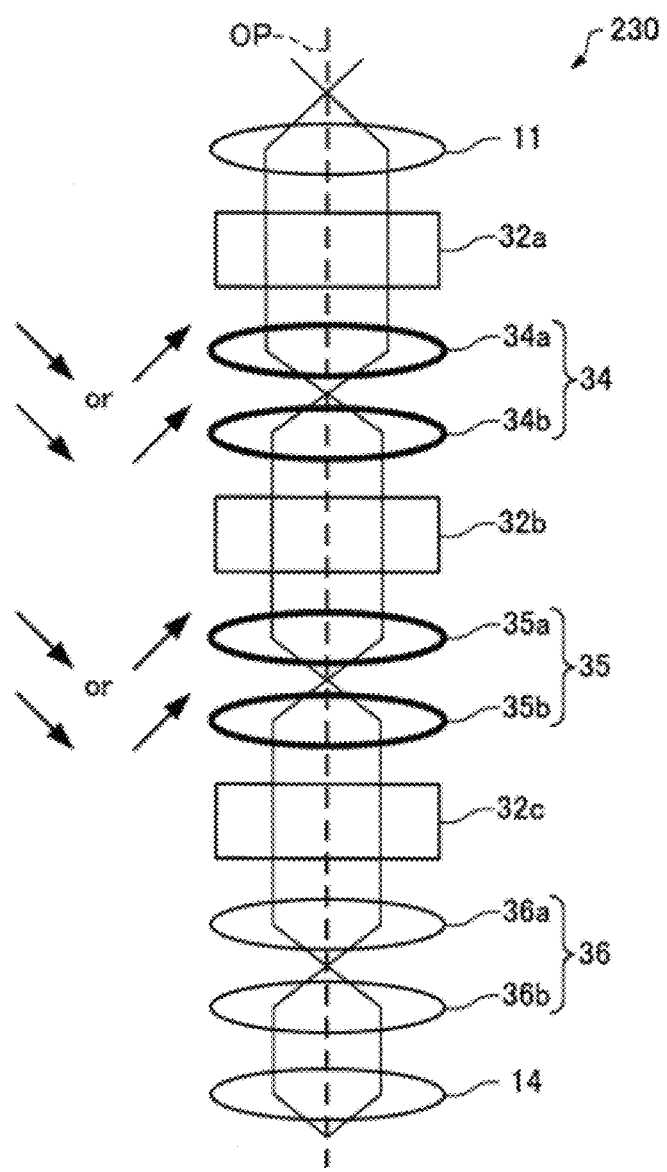
FIG. 10 is an electron ray diagram illustrating the manner in which three-fold symmetric distortion in the shadow of the condenser aperture is corrected by varying excitations of first and second transfer lens systems.
Figure 11:
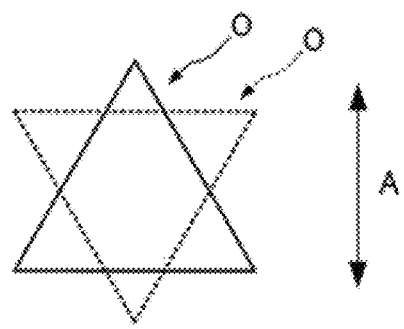
FIG. 11 is a schematic diagram of the three-fold symmetric component of the distortion in the shadow of the condenser aperture which varies with varying the excitation of the first transfer lens system.
Figure 12:
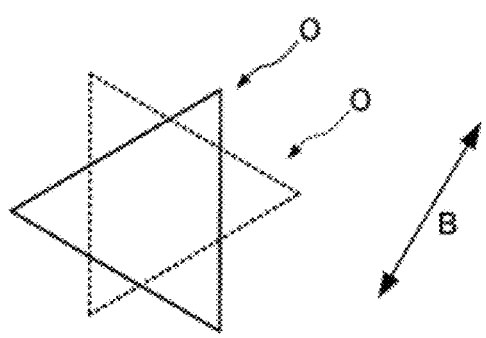
FIG. 12 is a schematic diagram of the three-fold symmetric component of the distortion in the shadow of the condenser aperture which varies with varying the excitation of the second transfer lens system.

FIG. 10 is an electron ray diagram illustrating the manner in which the three-fold symmetric distortion in the shadow of the condenser aperture 12 is corrected by varying excitations of the first transfer lens system 34 and second transfer lens system 35. FIG. 11 is a schematic diagram of the three-fold symmetric component O of the distortion in the shadow of the condenser aperture 12 which varies with varying the excitations of the first transfer lens system 34. FIG. 12 is a schematic diagram of the three-fold symmetric component O of the distortion in the shadow of the condenser aperture 12 which varies with varying the excitations of the second transfer lens system 35.

Because the above-described aberration corrector 30 shown in FIG. 2 has the two stages of multipole elements 32a and 32b, the three-fold symmetric component of the distortion in the shadow of the condenser aperture 12 is directed in a certain direction. That is, the triangle formed by distortion in the shadow of the condenser aperture 12 always faces in the same direction.

On the other hand, the aberration corrector 230 shown in FIG. 9 has three stages of multipole elements 32a, 32b, and 32c and so the three-fold symmetric component of the distortion in the shadow of the condenser aperture 12 is oriented in various directions. That is, the triangle formed by distortion in the shadow of the condenser aperture 12 faces in various directions.

Therefore, in the present embodiment, as shown in FIG. 10, the excitations of the first transfer lens 34a and second transfer lenses 34b are varied such that the excitations are both increased or both decreased. Consequently, as shown in FIG. 11, the three-fold symmetric component O of the distortion in the shadow of the condenser aperture 12 which lies in a given direction (herein referred to as A direction) can be varied. Hence, the three-fold symmetric component O of the distortion in the shadow of the condenser aperture 12 which is in the A direction can be corrected.

Similarly, the excitations of the first transfer lens 35a and the second transfer lens 35b are so varied that the excitations are both increased or both decreased. Consequently, as shown in FIG. 12, the three-fold symmetric component O of the distortion in the shadow of the condenser aperture 12 which lies in B direction different from the A direction can be varied. Thus, the three-fold symmetric component O of the distortion in the shadow of the condenser aperture 12 which is in the B direction can be corrected.

As noted above, the amount of variation of the three-fold distortion in the shadow of the condenser aperture 12 can be made larger than the amount of variation of the three-lobe aberration by varying the excitations of the first transfer lens system 34 and second transfer lens system 35.

The step S104 of correcting the three-lobe aberration is next described. In the present embodiment, the correction of the three-lobe aberration can be carried out by varying excitations of the first transfer lens system 34 disposed between the first multipole element 32a and second multipole element 32b and excitations of the second transfer lens system 35 disposed between the second multipole element 32b and third multipole element 32c.

Figure 13:
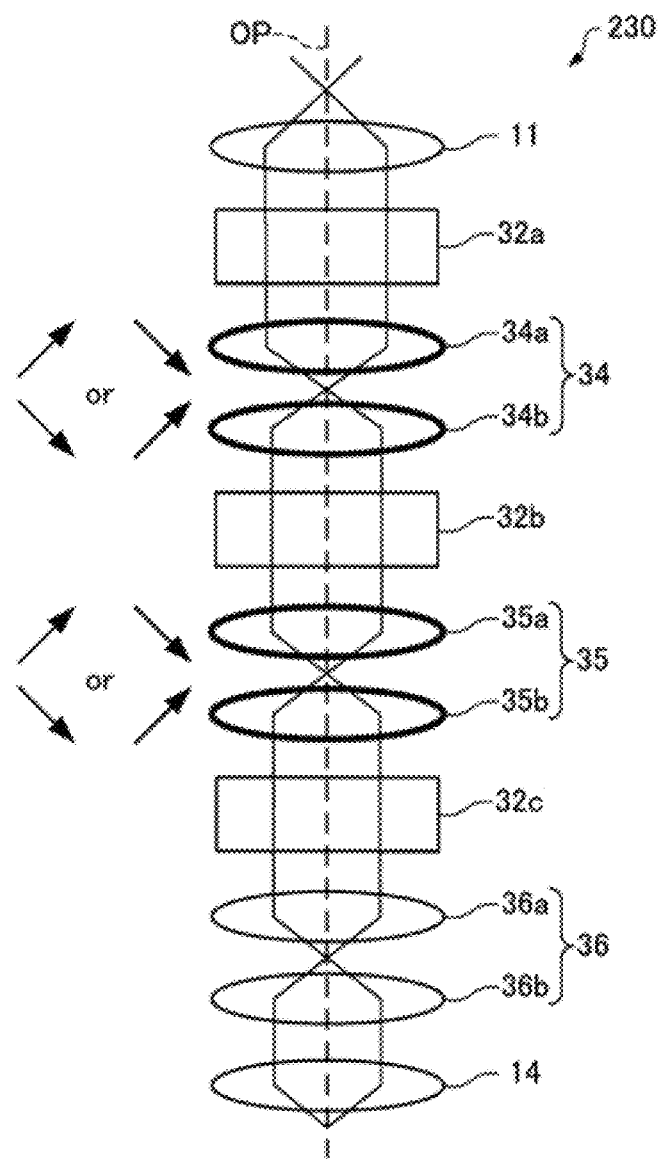
FIG. 13 is an electron ray diagram illustrating the manner in which three-lobe aberration is corrected by varying the excitations of the first and second transfer lens systems.
Figure 14:
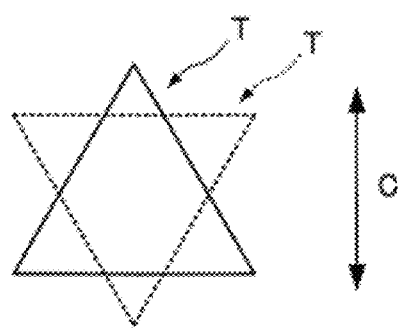
FIG. 14 is a schematic diagram of three-lobe aberration which varies with varying the excitation of the first transfer lens system.
Figure 15:
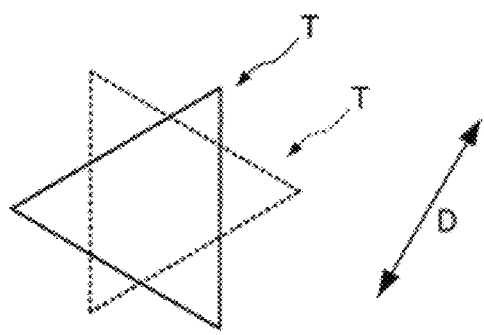
FIG. 15 is a schematic diagram of three-lobe aberration which varies with varying the excitation of the second transfer lens system.

FIG. 13 is an electron ray diagram illustrating the manner in which the three-lobe aberration is corrected by varying the excitations of the first transfer lens system 34 and second transfer lens system 35. FIG. 14 is a schematic diagram of a three-lobe aberration T which varies with changing an excitation of the first transfer lens system 34. FIG. 15 is a schematic diagram of the three-lobe aberration T which varies with varying an excitation of the second transfer lens system 35.

The above-described aberration corrector 30 has the two stages of multipole elements 32a and 32b and so the three-lobe aberration is directed in a certain direction. On the other hand, the aberration corrector 230 has the three stages of multipole elements 32a, 32b, and 32c and, therefore, the three-lobe aberration faces in various directions.

Therefore, in the present embodiment, as shown in FIG. 13, the excitations of the first transfer lens 34a and second transfer lens 34b are varied such that the excitation of one of the lenses 34a, 34b is increased, while the excitation of the other is reduced. Consequently, as shown in FIG. 14, the three-lobe aberration T in a given direction (C direction) can be varied. As a result, the three-lobe aberration T in the C direction can be corrected.

Similarly, the excitations of the first transfer lens 35a and the second transfer lens 35b are so varied that the excitation of one of the lenses 35a, 35b is increased while the excitation of the other is decreased. Consequently, as shown in FIG. 15, the three-lobe aberration T in D direction different from the C direction can be varied. Thus, the three-lobe aberration T in the D direction can be corrected.

The amount of variation of the three-lobe aberration can be made larger than the amount of variation of the three-fold symmetric distortion in the shadow of the condenser aperture 12 by varying the excitations of the first transfer lens system 34 and second transfer lens system 35 as described above.

The method of distortion correction associated with the present embodiment is for use in the electron microscope 200 equipped with the aberration corrector 230 having the three stages of multipole elements 32a, 32b, and 32c and can correct the three-fold symmetric distortion in the shadow of the condenser aperture 12 as described above.

3. Third Embodiment

3.1. Electron Microscope

Figure 16:
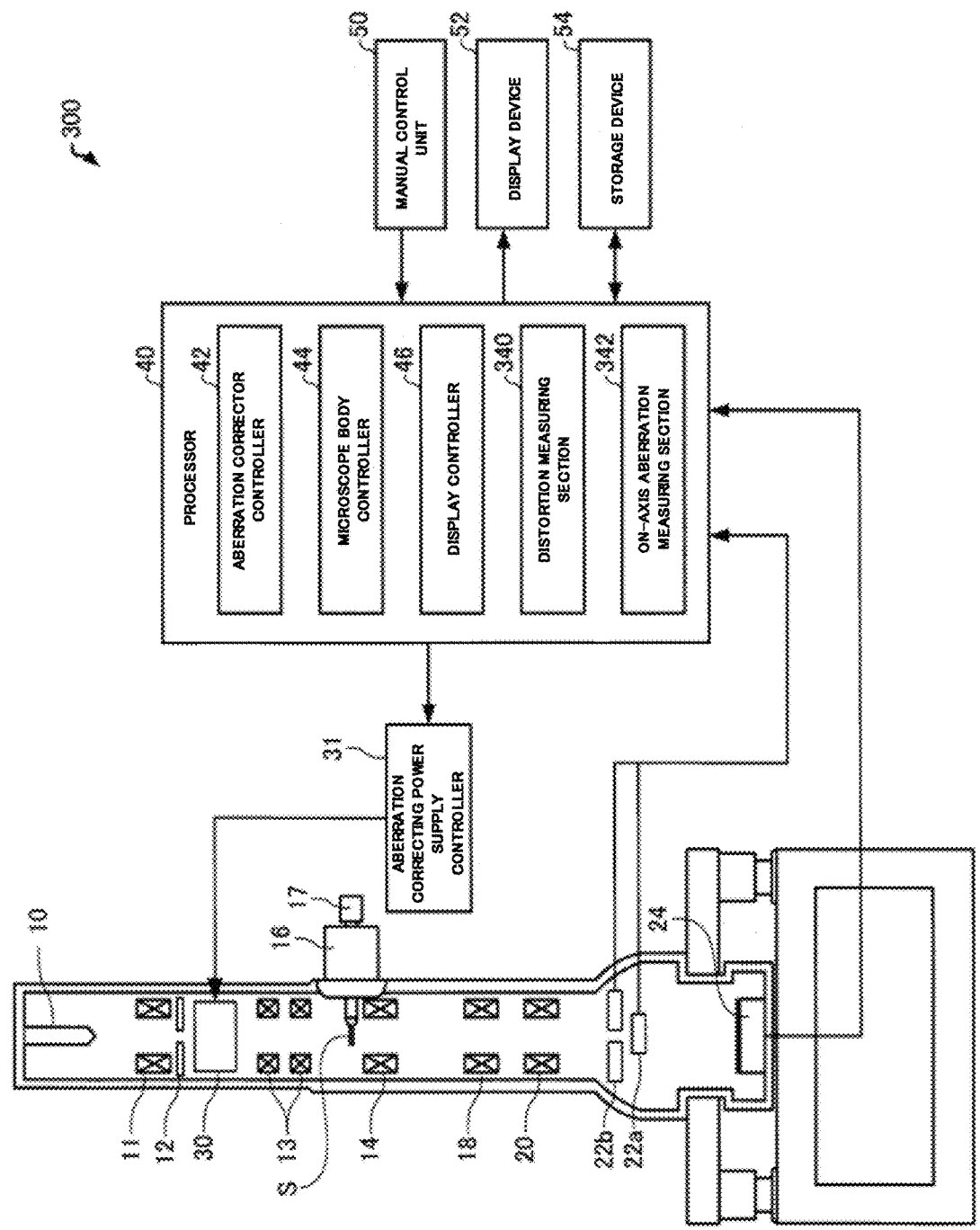
FIG. 16 is a vertical cross section, partly in block form, of an electron microscope associated with a third embodiment.

An electron microscope associated with a third embodiment is next described by referring to FIG. 16, which shows the configuration of the electron microscope, 300, associated with the third embodiment. Those members of the electron microscope 300 which are similar in function to their respective counterparts of the electron microscope 100 associated with the first embodiment are indicated by the same reference numerals as in the above cited figures and a detailed description thereof is omitted.

As shown in FIG. 16, the electron microscope 300 is different from the electron microscope 100 shown in FIG. 1 in that the processor 40 includes a distortion measuring section 340 and an on-axis aberration measuring section 342.

The distortion measuring section 340 performs processing to measure the three-fold symmetric distortion in the shadow of the condenser aperture 12. More specifically, the distortion measuring section 340 obtains an image of the shadow of the condenser aperture 12, extracts the shape of the shadow of the condenser aperture 12 from the image, and quantifies the three-fold symmetric component of the distortion in the shadow of the condenser aperture 12.

The on-axis aberration measuring section 342 performs processing to measure the on-axis aberration by an SRAM method or a probe tableau method. Where the on-axis aberration is measured by a probe tableau method, for example, the on-axis aberration measuring section 342 obtains a plurality of STEM images while varying the angle of impingement of an electron beam on the sample surface, deconvolutes the STEM images to produce probe images, and measures aberrations based on the probe images.

In the present embodiment, the aberration corrector controller 42 provides control based on the results of measurements of the distortion in the shadow of the condenser aperture 12 made by the distortion measuring section 340 to vary excitations of the transfer lens system 34, thus correcting the three-fold symmetric distortion in the shadow of the condenser aperture 12. The aberration corrector controller 42 varies the excitations of both first transfer lens 34a and second transfer lens 34b on the basis of the results of measurements of the distortion in the shadow of the condenser aperture 12 such that the excitations are both increased or both decreased.

Furthermore, the aberration corrector controller 42 provides control based on the results of measurements of the on-axis aberration performed by the on-axis aberration measuring section 342 to vary excitations of the transfer lens system 34 so that the three-lobe aberration is corrected. The aberration corrector controller 42 varies the excitations of the first transfer lens 34a and the second transfer lens 34b such that the excitation of one of the transfer lenses 34a, 34b increases while the excitation of the other decreases.

When excitations of the transfer lens system 34 are varied to correct the three-lobe aberration, a three-fold symmetric distortion may be induced again in the shadow of the condenser aperture 12. Therefore, the aberration corrector controller 42 performs processing to make a decision as to whether the three-fold symmetric distortion in the shadow of the condenser aperture 12 has been corrected after correction of the three-lobe aberration.

3.2. Operation of Electron Microscope

The operation of the electron microscope 300 associated with the third embodiment is next described. Processing performed by the processor 40 of the electron microscope 300 to correct the three-fold symmetric distortion in the shadow of the condenser aperture 12 is described below.

Figure 17:
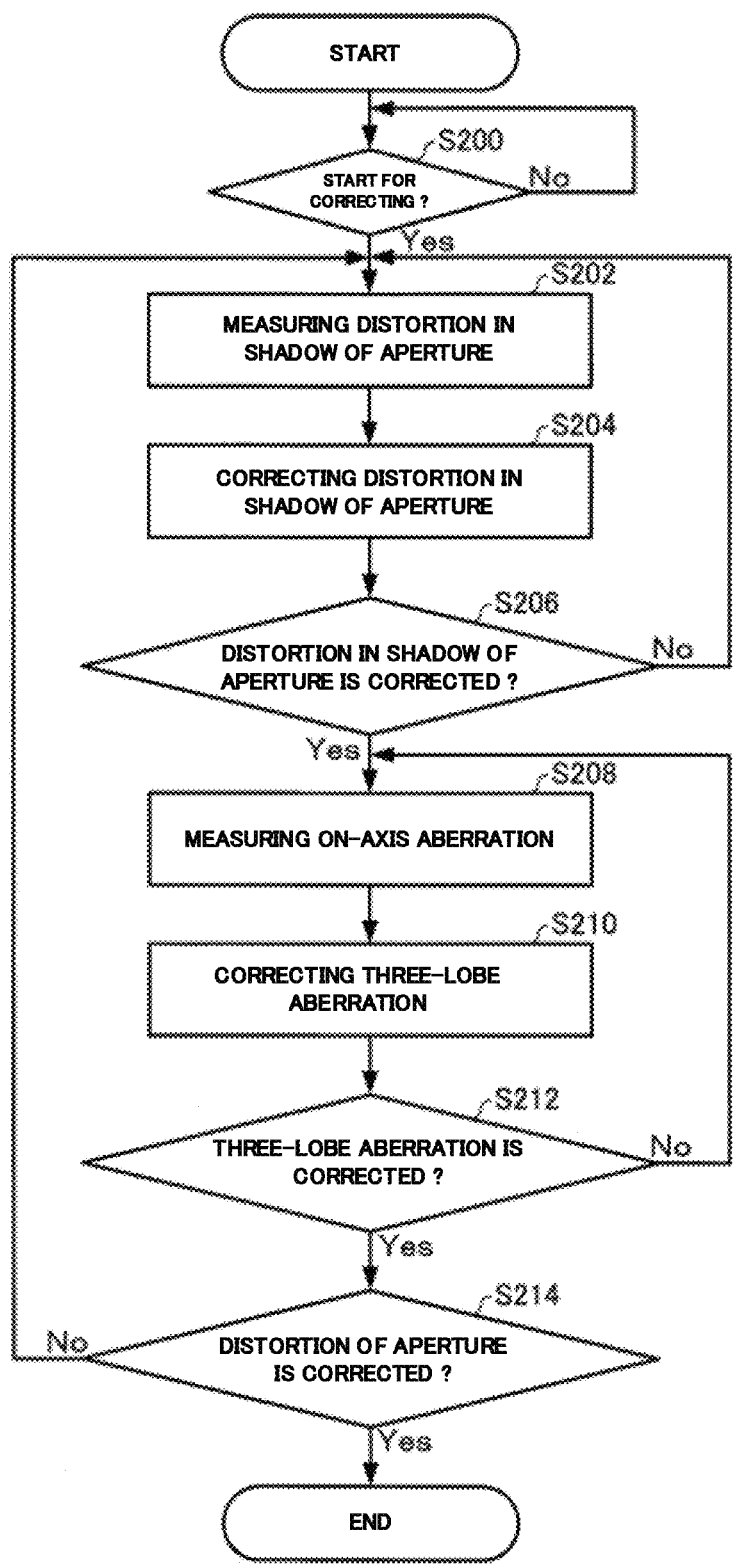
FIG. 17 is a flowchart illustrating one example of the method of the electron microscope shown in FIG. 16.

FIG. 17 is a flowchart illustrating one example of operational sequence performed by the electron microscope 300 associated with the third embodiment. The processor 40 makes a decision as to whether the user has issued an instruction for starting a distortion correction (instruction for starting) (S200) and waits until an instruction for starting is issued (the decision at step S200 is No). If an instruction for starting is entered from the manual control unit 50, for example, the processor 40 determines that the user has issued an instruction for starting.

If the decision at step S200 is Yes, indicating that an instruction for starting has been issued, the distortion measuring section 340 measures the three-fold symmetric distortion in the shadow of the condenser aperture 12 (S202). Then, the aberration corrector controller 42 provides control to vary excitations of the transfer lens system 34 on the basis of the results of the measurements of the three-fold symmetric distortion in the shadow of the condenser aperture 12 (S204). Then, the distortion measuring section 340 again measures the three-fold symmetric distortion in the shadow of the condenser aperture 12. The aberration corrector controller 42 makes a decision based on the results of the measurements as to whether the three-fold symmetric distortion in the shadow of the condenser aperture 12 has been corrected (S206).

If the decision at step S206 is No, indicating that the three-fold symmetric distortion in the shadow of the condenser aperture 12 is uncorrected, control goes back to step S202. The sequence of steps S202, S204, and S206 is performed repeatedly until it is determined that the three-fold symmetric distortion in the shadow of the condenser aperture 12 has been corrected.

If the decision at step S206 is Yes, indicating that the three-fold symmetric distortion in the shadow of the condenser aperture 12 has been corrected, then the on-axis aberration measuring section 342 measures the on-axis aberration (S208). Then, the aberration correction controller 42 provides control based on the result of the measurement of the on-axis aberration to vary excitations of the transfer lens system 34 (S210). Then, the on-axis aberration measuring section 342 again measures the on-axis aberration, and the aberration corrector controller 42 makes a decision based on the result of the measurement as to whether the three-lobe aberration has been corrected (S212).

If the decision at step S212 is No, indicating that the three-lobe aberration is uncorrected, then control proceeds back to step S208. The sequence of steps S208, S210, and S212 is performed repetitively until it is determined that the three-lobe aberration has been corrected.

If the decision at step S212 is Yes, indicating that the three-lobe aberration has been corrected, the distortion measuring section 340 measures the three-fold symmetric distortion in the shadow of the condenser aperture 12. The aberration corrector controller 42 makes a decision based on the results of measurements as to whether the three-fold symmetric distortion in the shadow of the condenser aperture 12 has been corrected (S214).

If the decision at step S214 is No, indicating that the three-fold symmetric distortion in the shadow of the condenser aperture 12 is uncorrected, control goes back to step S202. On the other hand, if the decision at step S214 is Yes, indicating that the three-fold symmetric distortion in the shadow of the condenser aperture 12 has been corrected, the processor 40 ends the present processing subroutine.

The electron microscope 300 has the following features. The electron microscope 300 includes the illumination system having the aberration corrector 30 and the condenser aperture 12, the distortion measuring section 340 for measuring distortion in the shadow of the condenser aperture 12, and the aberration corrector controller 42 for controlling the aberration corrector 30 that has the two stages of multipole elements 32a and 32b and the transfer lens system 34 disposed between the multipole elements 32a and 32b. The aberration corrector controller 42 provides control based on the results of measurements of the distortion in the shadow of the condenser aperture 12 to vary excitations of the transfer lens system 34. Therefore, in the electron microscope 300, the three-fold symmetric distortion in the shadow of the condenser aperture 12 can be corrected automatically.

In the electron microscope 300, the aberration corrector controller 42 varies the excitations of both first transfer lens 34a and second transfer lens 34b on the basis of the results of measurements of the condenser aperture 12 such that the excitations are both increased or both decreased. Consequently, when the three-fold symmetric distortion in the shadow of the condenser aperture 12 is corrected, the amount of variation of the three-lobe aberration can be reduced.

The electron microscope 300 includes the on-axis aberration measuring section 342 for measuring on-axis aberration. The aberration corrector controller 42 provides control based on the results of measurements of the on-axis aberration to vary excitations of the transfer lens system 34. Therefore, in the electron microscope 300, three-lobe aberration induced concomitantly with the correction of the three-fold symmetric distortion in the shadow of the condenser aperture 12 can be corrected automatically.

In the electron microscope 300, the aberration corrector controller 42 varies the excitations of the first transfer lens 34a and the second transfer lens 34b on the basis of the results of measurements of the on-axis aberration such that the excitation of one of the lenses 34a and 34b is increased while the excitation of the other is reduced. Therefore, when the three-lobe aberration is corrected, the amount of variation of the three-fold symmetric distortion in the shadow of the condenser aperture 12 can be reduced.

In the foregoing example, the electron microscope 300 is configured including the aberration corrector 30 which has the two stages of multipole elements 32a and 32b. Alternatively, the electron microscope 300 may be configured including the aberration corrector 230 (see FIG. 9) having three stages of multipole elements 32a, 32b, and 32c. In this case, the electron microscope is similar in operation to the above-described operation except that the technique described in the second embodiment is used for the step S204 of correcting distortion in the shadow of the condenser aperture 12 and for the step S210 of correcting the three-lobe aberration as illustrated in FIG. 17.

4. Other Embodiments

It is to be noted that the present invention is not restricted to the above-described embodiments but rather can be implemented in variously modified forms without departing from the gist of the present invention. For example, in the above-described first embodiment, there is described the method of correcting three-fold symmetric distortion in the shadow of the condenser aperture 12 produced by three-fold fields emanating from the first multipole element 32a and the second multipole element 32b which together constitute the aberration corrector 30, as well as the three-lobe aberration (on-axis aberration of three-fold symmetry) induced by the correction of the three-fold symmetric distortion. The method of distortion correction associated with the present invention is not restricted to this method. For example, N-fold symmetric distortion in the shadow of the condenser aperture 12 produced by the generation of N-fold fields (where N is an integer equal to or greater than 2) from the first and second multipole elements constituting the aberration corrector and on-axis aberration of N-fold symmetry induced as a result of the correction of the N-fold symmetric distortion may be corrected. Even in this case, the N-fold symmetric distortion in the shadow of the condenser aperture 12 and the on-axis aberration of N-fold symmetry can be corrected by controlling the excitation of the transfer lens system 34 in the same way as in the above-described first embodiment.

Similarly, in the above-described second embodiment, there is described the method of correcting three-fold symmetric distortion in the shadow of the condenser aperture 12 produced by three-fold fields emanating from the first multipole element 32a and the second multipole element 32b which together constitute the aberration corrector 30, as well as the three-lobe aberration (on-axis aberration of three-fold symmetry) induced by the correction of the three-fold symmetric distortion. In the method of distortion correction associated with the present invention, N-fold symmetric distortion in the shadow of the condenser aperture 12 produced by N-fold fields emanating from the first and second multipole elements which together constitute the aberration corrector and on-axis aberration of N-fold symmetry induced by the correction of the N-fold symmetric distortion may be corrected. Even in this case, the N-fold symmetric distortion in the shadow of the condenser aperture 12 and the on-axis aberration of N-fold symmetry can be corrected by controlling excitations of the transfer lens systems 34 and 35 in the same way as in the above-described second embodiment.

In addition, in the foregoing description of the above embodiments, distortion in the shadow of the condenser aperture 12 is corrected. The method of distortion correction associated with the present invention is also applicable to illumination apertures other than the condenser aperture 12. For example, where a measurement is made by a DPC method, if the shadow of an illumination aperture other than the condenser aperture 12 is used as the shadow of an aperture projected onto a segmented detector, then distortion in the shadow of the aperture may be corrected by the method of distortion correction associated with the present invention.

Additionally, in the above-described first embodiment, the aberration corrector 30 has the two stages of multipole elements 32a and 32b as shown in FIG. 2. In the above-described second embodiment, the aberration corrector 230 has the three stages of multipole elements 32a, 32b, and 32c as shown in FIG. 9. Alternatively, the aberration corrector may have four or more stages of multipole elements. Even in this case, distortion in the shadow of the condenser aperture 12 can be corrected by varying excitations of the transfer lens systems disposed between the successive multipole elements in the same way as in the cases of two stages and three stages.

It is to be understood that the foregoing embodiments and modified examples are merely exemplary and that the present invention is restricted to them. For example, the embodiments and modified examples can be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A method of distortion correction for use in a charged particle beam system including an illumination system having a built-in aberration corrector which contains a plurality of multipole elements and a transfer lens system disposed between the multipole elements to correct distortion in a shadow of an aperture of the illumination system, said method comprising:
    varying excitations of the transfer lens system to correct the distortion in the shadow of the aperture.

2. The method of distortion correction as set forth in claim 1, wherein said transfer lens system comprises a first transfer lens and a second transfer lens.

3. The method of distortion correction as set forth in claim 2, wherein during the step of correcting the distortion in the shadow of said aperture, excitations of said first and second transfer lenses are varied in such a manner that the excitations are both increased or both decreased.

4. The method of distortion correction as set forth in claim 2, further comprising varying excitations of said transfer lens system to correct on-axis aberration.

5. The method of distortion correction as set forth in claim 4, wherein during the step of correcting said on-axis aberration, excitations of said first and second transfer lenses are varied such that the excitation of one of the first and second transfer lenses is increased while the excitation of the other is decreased.

6. The method of distortion correction as set forth in claim 4, wherein each of said plurality of multipole elements produces a three-fold field, and wherein during the step of correcting said on-axis aberration, three-lobe aberration is corrected.

7. The method of distortion correction as set forth in claim 1, wherein each of said plurality of multipole elements produces a three-fold field, and wherein during the step of correcting the distortion in the shadow of said aperture, three-fold symmetric distortion in the shadow of said aperture is corrected.

8. The method of distortion correction as set forth in claim 1, wherein said charged particle beam system is a scanning transmission electron microscope.

9. A charged particle beam system comprising:
an illumination system including an aberration corrector and an aperture, the aberration corrector containing a plural stages of multipole elements and a transfer lens system disposed between the multipole elements;
a distortion measuring section for measuring distortion in a shadow of the aperture; and
a controller for controlling the aberration corrector, wherein the controller provides control based on a result of measurement of the distortion in the shadow of the aperture to vary excitations of the transfer lens system.

10. The charged particle beam system as set forth in claim 9, wherein said transfer lens system comprises a first transfer lens and a second transfer lens.

11. The charged particle beam system as set forth in claim 10, wherein said controller varies excitations of said first and second transfer lenses based on a result of the measurement of the distortion in the shadow of said aperture such that the excitations are both increased or both decreased.

12. The charged particle beam system as set forth in claim 10, further comprising an on-axis aberration measuring section for measuring on-axis aberration, and wherein said controller provides control based on a result of the measurement of the on-axis aberration to vary the excitations of said transfer lens system.

13. The charged particle beam system as set forth in claim 12, wherein said controller varies excitations of said first and second transfer lenses based on a result of the measurement of said on-axis aberration such that the excitation of one of the first and second transfer lenses is increased while the excitation of the other is decreased.

* * * * *